(12) United States Patent
Bergmann et al.

(10) Patent No.: US 9,637,822 B2
(45) Date of Patent: May 2, 2017

(54) MULTI-ROTATION EPITAXIAL GROWTH APPARATUS AND REACTORS INCORPORATING SAME

(75) Inventors: Michael John Bergmann, Chapel Hill, NC (US); David Todd Emerson, Chapel Hill, NC (US); David Dean Seibel, Morrisville, NC (US)

(73) Assignee: Cree, Inc., Durham, NC (US)

(*) Notice: Subject to any disclaimer, the term of this patent is extended or adjusted under 35 U.S.C. 154(b) by 1972 days.

(21) Appl. No.: 12/900,655

(22) Filed: Oct. 8, 2010

(65) Prior Publication Data

US 2011/0083602 A1    Apr. 14, 2011

Related U.S. Application Data

(60) Provisional application No. 61/250,075, filed on Oct. 9, 2009.

(51) Int. Cl.
*C30B 25/12* (2006.01)
*C23C 16/458* (2006.01)
*H01L 21/687* (2006.01)

(52) U.S. Cl.
CPC .......... *C23C 16/4584* (2013.01); *C30B 25/12* (2013.01); *H01L 21/68764* (2013.01); *H01L 21/68771* (2013.01)

(58) Field of Classification Search
USPC .......................... 117/200, 201; 118/724, 719
See application file for complete search history.

(56) References Cited

U.S. PATENT DOCUMENTS

| | | | |
|---|---|---|---|
| 3,424,628 A | 1/1969 | Winnings | |
| 3,783,822 A | 1/1974 | Wollam | |
| 4,748,135 A | 5/1988 | Frijlink | |
| 4,961,399 A | 10/1990 | Frijlink | |
| 5,788,777 A | 8/1998 | Burk, Jr. | |

(Continued)

FOREIGN PATENT DOCUMENTS

| | | | |
|---|---|---|---|
| JP | S 63147894 A | 6/1988 | |
| JP | H01-133320 A | 5/1989 | |

(Continued)

OTHER PUBLICATIONS

Extended European Search Report corresponding to European Patent Application No. EP 10 82 2731; Dated Oct. 7, 2013; 8 pages.

(Continued)

*Primary Examiner* — Robert M Kunemund
(74) *Attorney, Agent, or Firm* — Myers Bigel, P.A.

(57) ABSTRACT

A susceptor apparatus for use in a CVD reactor includes a main platter with a central gear. The main platter has opposite first and second sides, a central recess formed in the second side, and a plurality of circumferentially spaced-apart pockets formed in the first side. The central gear is positioned within the central recess and the satellite platters are individually rotatable within the respective pockets. Each pocket has a peripheral wall with an opening in communication with the central recess. The central gear teeth extend into each of the pockets via the respective wall openings and engage a planet gear associated with each satellite platter. Rotation of the main platter about its rotational axis causes the satellite platters to rotate about their individual rotational axes.

27 Claims, 10 Drawing Sheets

(56) References Cited

U.S. PATENT DOCUMENTS

| | | |
|---|---|---|
| 6,797,069 B2 | 9/2004 | Paisley et al. |
| 6,837,940 B2 * | 1/2005 | Komeno et al. ............. 118/730 |
| 2002/0083899 A1 | 7/2002 | Komeno et al. |
| 2003/0029384 A1 | 2/2003 | Nishikawa |
| 2005/0051099 A1 | 3/2005 | Preti et al. |
| 2005/0126497 A1 | 6/2005 | Kidd et al. |

FOREIGN PATENT DOCUMENTS

| | | |
|---|---|---|
| JP | 4028860 A | 1/1992 |
| JP | H06-314656 A | 11/1994 |
| JP | H08-083834 A | 3/1996 |

OTHER PUBLICATIONS

Notification of Transmittal of the International Search Report and the Written Opinion of the International Searching Authority issued by the United States Patent Office for corresponding PCT Application No. PCT/US2010/051905.

Official Action corresponding to Japanese Patent Application No. 2012-533333 dated Sep. 19, 2013 and English Translation; 4 pages.

First Office Action corresponding to Chinese Patent Application No. 201080055924.1 dated Apr. 30, 2014 and English Translation; 13 pages.

\* cited by examiner

MULTI-ROTATION EPITAXIAL GROWTH APPARATUS AND REACTORS INCORPORATING SAME

RELATED APPLICATION

This application claims the benefit of and priority to U.S. Provisional Patent Application No. 61/250,075, filed Oct. 9, 2009, the disclosure of which is incorporated herein by reference as if set forth in its entirety.

FIELD OF THE INVENTION

The present invention relates to the growth of epitaxial layers and, more particularly, chemical vapor deposition reactor systems and apparatus.

BACKGROUND

Deposition systems and methods are commonly used to form layers of semiconductor materials, such as thin epitaxial films (epilayers), on substrates. For example, a chemical vapor deposition (CVD) reactor system and process may be used to form a layer of semiconductor material such as silicon carbide (SiC), gallium nitride (GaN), or other materials on a substrate. CVD processes may be particularly effective for forming layers with controlled properties, thicknesses, and/or arrangements such as epitaxial layers. Typically, in a deposition system, such as a CVD system, the substrate is placed in a reaction chamber within a susceptor and one or more process gases including reagents or reactants to be deposited on the substrate are introduced into the chamber adjacent the substrate. The process gases may be flowed through the reaction chamber in order to provide a uniform or controlled concentration of the reagents or reactants to the substrate.

CVD growth processes for silicon carbide have been refined in terms of temperature profiles, gas velocities, gas concentrations, chemistry, and pressure. The selection of conditions used to produce particular epilayers is often a compromise among factors such as desired growth rate, reaction temperature, cycle time, gas volume, equipment cost, doping uniformity, and layer thicknesses. In particular, and other factors being equal, uniform layer thicknesses tend to provide more consistent performance in semiconductor devices that are subsequently produced from the epitaxial layers. Alternatively, less uniform layers tend to degrade device performance, or even render the layers unsuitable for device manufacture. Accordingly, a need exists for CVD techniques for the epitaxial growth of, for example, silicon carbide, gallium nitride, or other materials that produce more uniform epitaxial layers.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

According to some embodiments of the present invention, a susceptor apparatus for use in a CVD reactor system includes a rotatable main platter and a plurality of rotatable satellite platters positioned on the main platter. The satellite platters are operably connected to the main platter such that rotation of the main platter about its rotational axis causes the satellite platters to rotate about their individual rotational axes. Each satellite platter has a wafer support surface configured to hold one or more wafers. In some embodiments, the wafer support surface of each satellite platter is circumferentially surrounded by a raised peripheral edge portion. In some embodiments, the wafer support surface of each satellite platter has a substantially flat configuration. In other embodiments, the wafer support surface of each satellite platter has a contoured configuration to facilitate uniform wafer temperatures. In some embodiments, a plurality of pockets are formed in the main platter, and each satellite platter is rotatably secured within a respective pocket.

According to other embodiments, a susceptor apparatus for use in a CVD reactor system includes a rotatable main platter, a plurality of rotatable satellite platters positioned on the main platter, and one or more wafer supports rotatably secured within each satellite platter. The satellite platters are operably connected to the main platter and the wafer supports are operably connected to respective satellite platters such that rotation of the main platter about its rotational axis causes the satellite platters to rotate about their individual rotational axes and the one or more wafer supports to rotate about their individual rotational axes.

According to some embodiments of the present invention, a susceptor apparatus for use in a CVD reactor system includes a main platter having a central gear, and a plurality of satellite platters supported within the main platter that are individually rotatable about respective axes in response to rotation of the main platter. The main platter has opposite first and second sides. A central recess is formed in the second side substantially coaxial with a rotational axis of the main platter. A plurality of circumferentially spaced-apart pockets are formed in the first side. The central gear is positioned within the central recess and is removably retained within the central recess by a plurality of retaining members positioned along a periphery of the central recess. The satellite platters are each rotatably secured within a respective pocket. Each satellite platter has a wafer support surface on a first side thereof and a planet gear on an opposite second side thereof.

Each pocket in the main platter has a peripheral wall with an opening in communication with the central recess. The central gear teeth extend into each of the pockets via the respective wall openings so as to engage with the planet gear teeth of each satellite platter. Because the planet gear of each satellite platter meshes with the central gear, rotation of the main platter about its rotational axis causes the satellite platters to rotate about their individual rotational axes within their respective pockets. This dual rotation of the satellite platters facilitates uniform epitaxial layer formation during a CVD process.

The main platter includes a coupling that extends outwardly from the main platter second side along the rotational axis of the main platter. The coupling is configured to receive the free end of a drive shaft therein and to cause the main platter to rotate in response to rotation of the drive shaft. The central gear includes a central aperture and the coupling extends through the central gear central aperture. The drive shaft is concentrically surrounded by a fixed tube having a free end that engages the central gear aperture when the drive shaft and coupling are engaged. The tube free end maintains the central gear in a stationary position as the drive shaft rotates the main platter about the main platter rotational axis such that the main platter rotates around the stationary central gear.

Each pocket in the main platter includes a spindle post and a first bearing surface, and each satellite platter second side includes a spindle recess and a second bearing surface. The spindle recess is configured to receive the spindle post therein such that the first and second bearing surfaces engage and such that the satellite platter can rotate about the spindle post within a pocket. In some embodiments one or both of the first and second bearing surfaces may include a low-friction material to facilitate rotation of a satellite platter.

In some embodiments, each pocket in the main platter includes a pedestal having a free end. The pedestal free end serves as a first bearing surface and the spindle post extends outwardly from the pedestal free end.

In other embodiments, each pocket in the main platter includes a spindle post and each satellite platter second side includes a spindle recess. The spindle recess is configured to receive the spindle post therein such that the spindle post both supports the satellite platter and allows the satellite platter to rotate without the need for bearing surfaces.

In some embodiments, the wafer support surface of each satellite platter is circumferentially surrounded by a raised edge portion.

In some embodiments, the wafer support surface of each satellite platter is substantially flat. In other embodiments, the wafer support surface of each satellite platter is contoured to facilitate uniform wafer temperature during epitaxial growth.

According to some embodiments of the present invention, an epitaxial growth reactor includes a reactor vessel and a susceptor apparatus rotatably disposed within the reactor vessel. The susceptor apparatus includes a rotatable drive shaft that extends into the reactor vessel from a wall of the vessel. A main platter is attached to the rotatable drive shaft. The main platter has opposite first and second sides, a central recess formed in the second side substantially coaxial with a rotational axis of the main platter, and a plurality of circumferentially spaced-apart pockets formed in the first side. A central gear is positioned within the central recess, and a plurality of satellite platters are each rotatably secured within a respective pocket in the main platter. Each satellite platter has a wafer support surface on a first side thereof and a planet gear on an opposite second side thereof. Each pocket has a peripheral wall with an opening in communication with the central recess. The central gear teeth extend into each of the pockets via the respective wall openings and engage with the planet gear teeth. As such, rotation of the main platter about its rotational axis causes the satellite platters to rotate about their individual rotational axes.

In some embodiments, a tube concentrically surrounds the drive shaft in spaced-apart relationship. The tube is secured at one end to the reactor vessel wall and at an opposite end to the central gear. The tube maintains the central gear in a stationary position as the drive shaft rotates the main platter about the main platter rotational axis, which causes individual rotation of the satellite platters.

According to some embodiments of the present invention, a method of rotating a susceptor apparatus is provided. The susceptor apparatus includes a main platter having a plurality of circumferentially spaced-apart pockets formed in a first side, a central gear adjacent a second side of the main platter, and a plurality of satellite platters rotatably secured within the respective pockets. Each satellite platter is operably associated with the central gear. The method includes rotating the main platter about a rotational axis while maintaining the central gear stationary such that the satellite platters rotate within their respective pockets about their individual rotational axes.

According to some embodiments of the present invention, a method of facilitating epitaxial growth on a substrate is provided. A substrate is positioned on a satellite platter that is rotatably positioned on a main platter. The satellite platter and main platter are operably connected such that mechanically rotating the main platter about its rotational axis causes the substrate to rotate about its rotational axis. The main platter may be rotated about its rotational axis via a single drive mechanism, such as a drive shaft coupled to an electric motor.

Susceptor apparatus, according to embodiments of the present invention, and epitaxial growth reactors incorporating same, have numerous advantages over conventional susceptors and reactors. Unlike conventional susceptor apparatus which typically require horizontal orientation within a reactor, susceptor apparatus, according to embodiments of the present invention, can be utilized in various orientations, including vertical as well as horizontal. Unlike conventional reactors which utilize gas to rotate wafers, susceptor apparatus, according to embodiments of the present invention, rotate wafers mechanically without the use of gas, thereby eliminating the introduction of impurities and unwanted gases. Also, gas used for wafer rotation in conventional reactors may undesirably cool wafers during processing. Embodiments of the present invention eliminate the possibility of such undesirable cooling.

Conventional susceptor apparatus are traditionally fixed within a reactor, which can hinder adequate cleaning and thereby potentially reduce the lifetime of the susceptor apparatus and reactor. Because susceptor apparatus according to the present invention are easily removable from a reactor, more thorough cleaning is possible which may lead to a longer lifetime.

Wafer support surfaces of conventional susceptor apparatus are typically flat, which can cause non-uniform wafer temperatures during processing. Moreover, rotation of conventional wafer support surfaces can be sensitive to physical characteristics of wafers, such as flatness and weight. In contrast, the wafer support surface of satellite platters of the present invention can have a non-flat contour that facilitates uniform wafer temperatures during epitaxial growth. In addition, rotation of satellite platters of the present invention is not sensitive to the wafer being processed. As such, embodiments of the present invention are particularly suitable for large wafer sizes and materials where the substrate and epitaxial layers are thermally or physically mismatched (e.g., gallium nitride on silicon carbide or sapphire, etc.).

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

DETAILED DESCRIPTION

Figure 1:
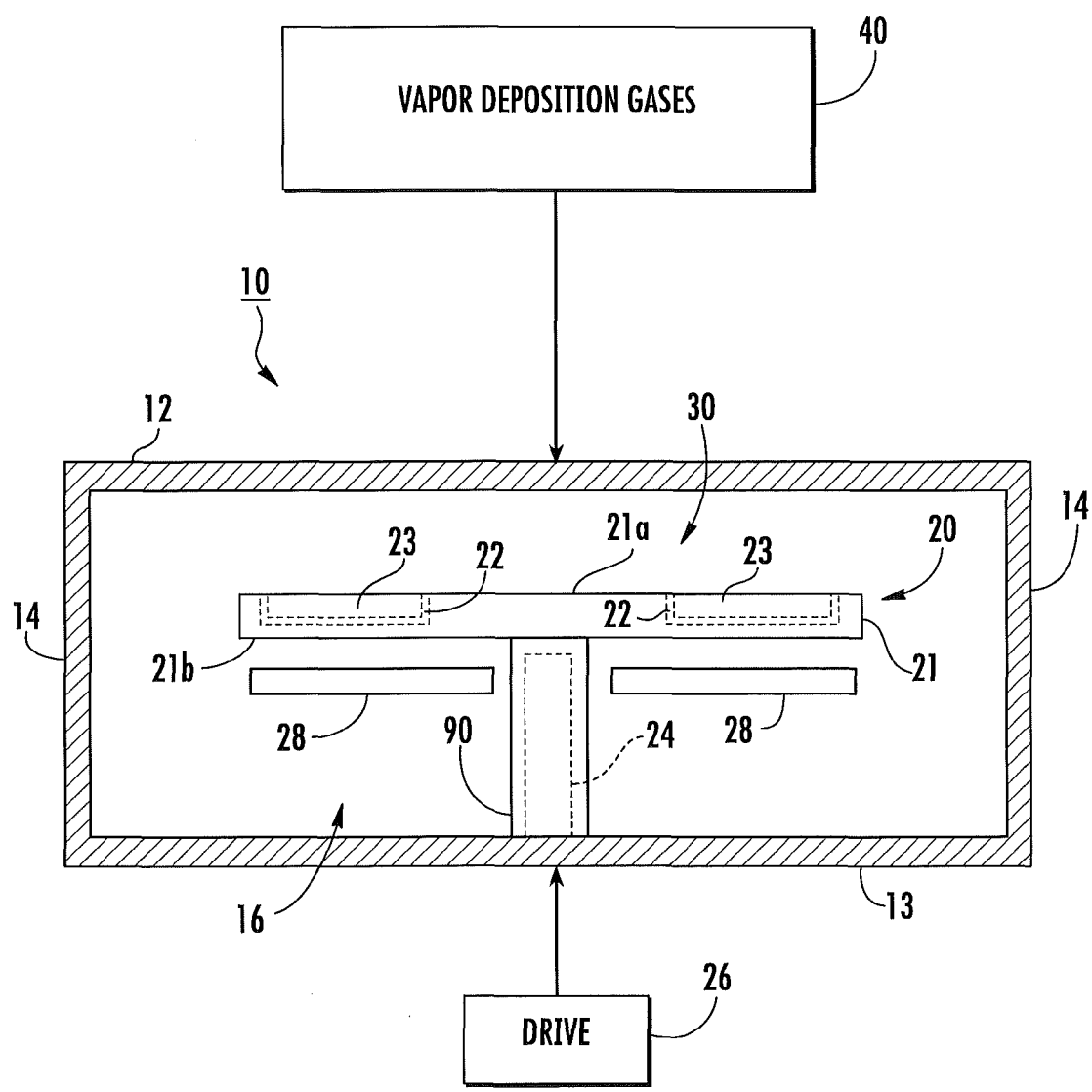
FIG. 1 is a schematic illustration of an epitaxial growth reactor with a susceptor apparatus, according to some embodiments of the present invention.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. Features described with respect to one figure or embodiment can be associated with another embodiment of figure although not specifically described or shown as such.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that although the terms first and second are used herein to describe various features or elements, these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

FIG. 1 illustrates a vapor phase epitaxial growth reactor 10, according to some embodiments of the present invention. The illustrated reactor 10 includes a top 12, a bottom 13, and side walls 14 that define an interior chamber or vessel 16. Disposed within the vessel 16 is a susceptor apparatus 20 that includes a main platter 21 having opposite first and second sides 21a, 21b. A plurality of pockets 22 are formed within the main platter first side 21a, each for accommodating a respective satellite platter 23.

The main platter 21 is coupled to, and rotated by, a drive shaft 24 which is rotatable about a central axis $A_1$ (FIG. 10) via a drive mechanism 26 (e.g., an electric motor, etc.), located outside of the vessel 16. Positioned below the main platter 21 is a heat source 28, such as, for example, a radio frequency (RF) heating coil arrangement or a resistive filament heating arrangement, that is operable to establish the required temperature for silicon carbide (or other material) growth within a reaction zone 30 of the vessel 16.

The reaction zone 30 is located between the upper surface 21a of the main platter 21 and the top 12 of the vessel 16. Vapor deposition gases 40 are introduced into the vessel 16, for example via a gas supply, and are utilized in the growth process, as would be understood by those skilled in the art of epitaxial growth. The susceptor apparatus 20 and growth reactor 10 may be utilized for various types of epitaxial growth, without limitation. For example, for nitride epitaxial growth, carrier gases such as hydrogen and/or nitrogen may be used; source gases for forming various nitrides may include trimethylgallium (TMG), triethylgallium (TEG), trimethylaluminum (TMA), trimethylindium (TMI), and the like; and various dopant gases may be utilized. For silicon carbide epitaxial growth, a carrier gas such as hydrogen, a source of silicon such as silane, a source of carbon such as propane, an etchant such as hydrogen chloride, and various dopant gases may be utilized. The various gases provided to the reaction zone 30 are thereafter removed to a location outside of the vessel 16, as would be understood by those skilled in the art.

The susceptor apparatus 20 is not limited only to use in a horizontal reactor 20, as illustrated in FIG. 1. The mechanical operation of the susceptor apparatus 20 allows it to be used in various orientations including, for example, a vertical orientation. As such, embodiments of the present invention may be utilized in vertical and horizontal reactors.

Figure 2:
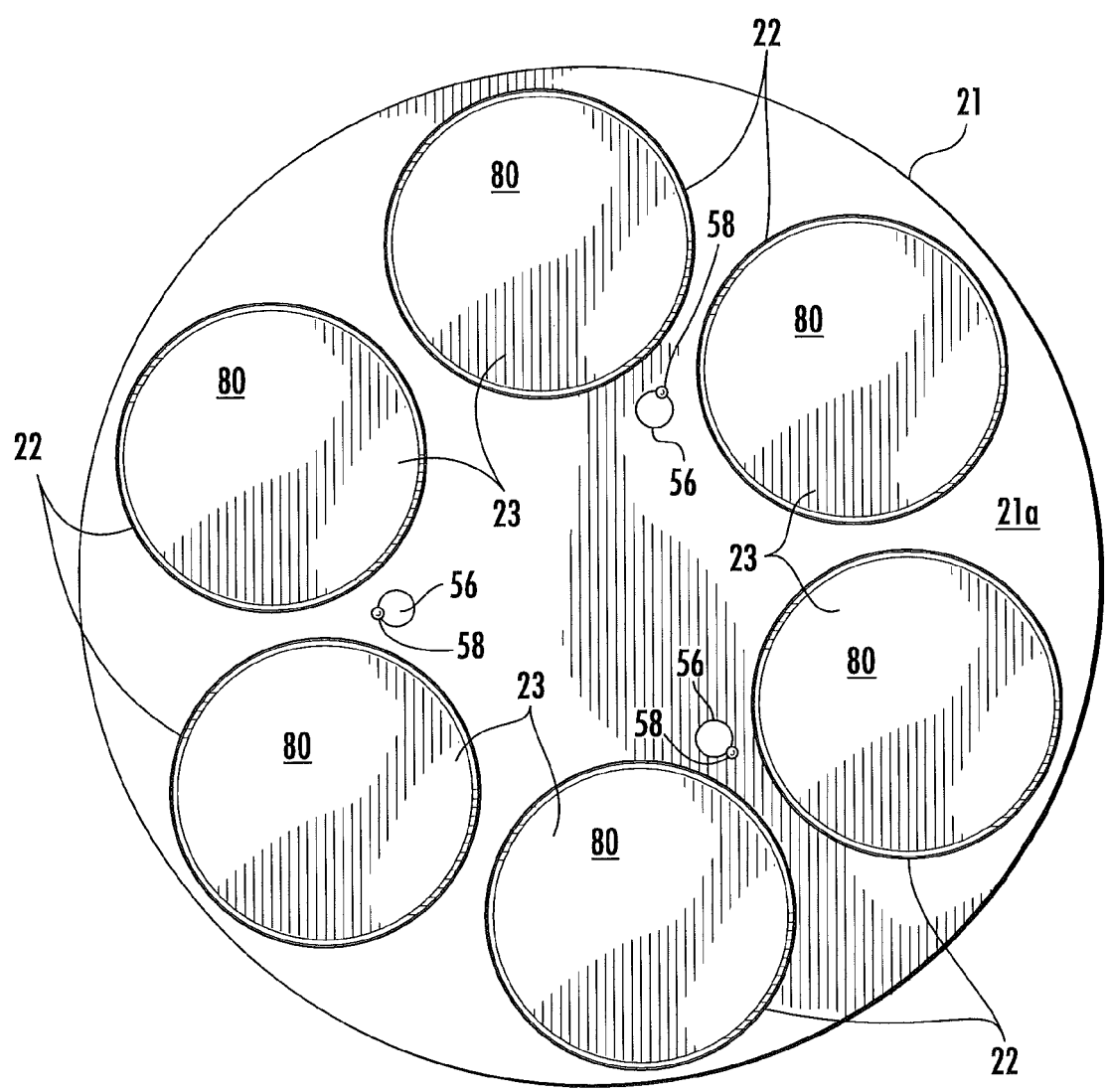
FIG. 2 is a top plan view of a main platter for the susceptor apparatus of FIG. 1 that illustrates a plurality of satellite platters, according to some embodiments of the present invention.
Figure 8:
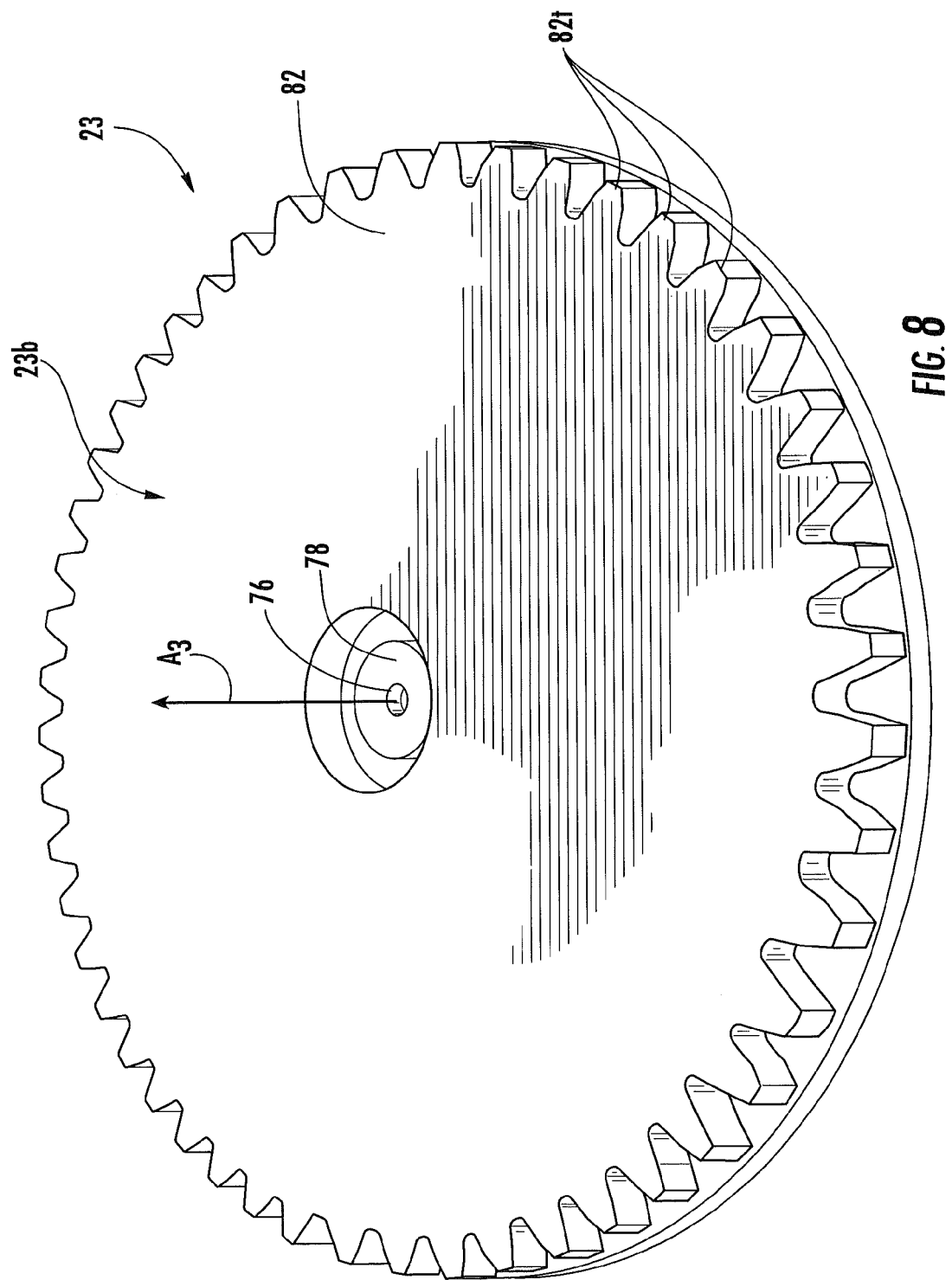
FIG. 8 is a bottom perspective view of a satellite platter of the susceptor apparatus of FIG. 2.
Figure 9:
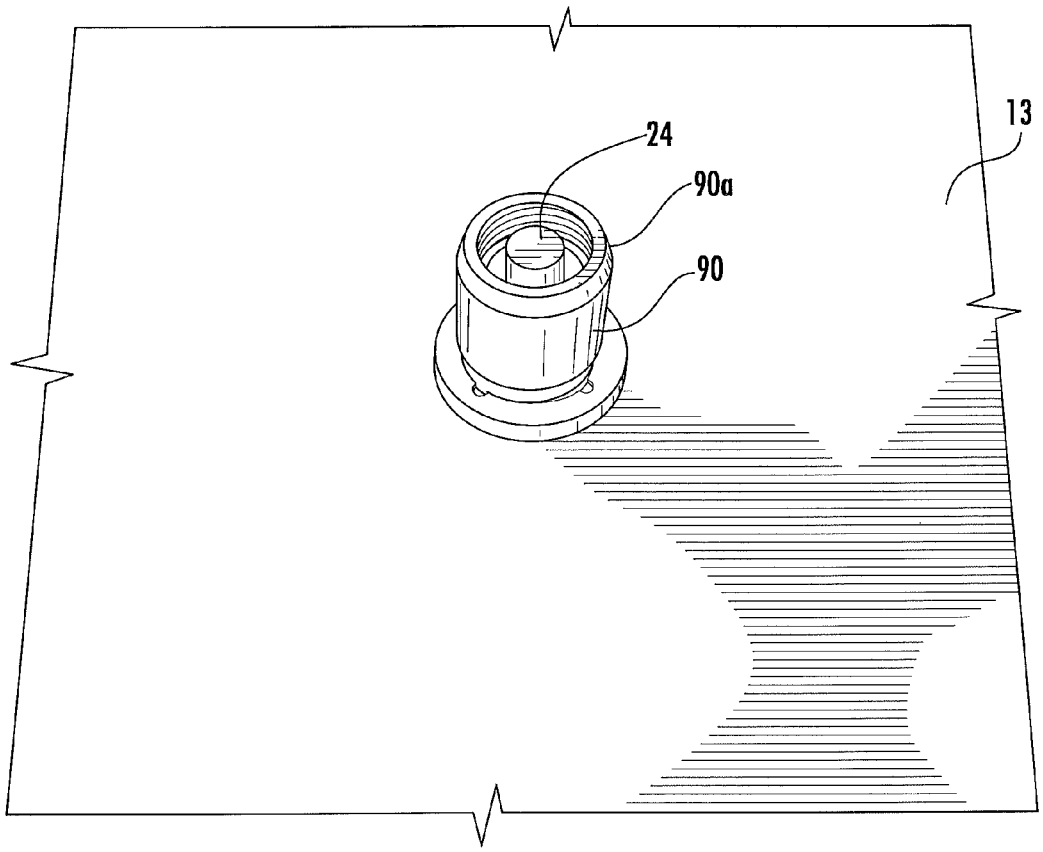
FIG. 9 is a top perspective view of a drive shaft assembly for the susceptor apparatus of FIG. 1, according to some embodiments of the present invention.
Figure 10:
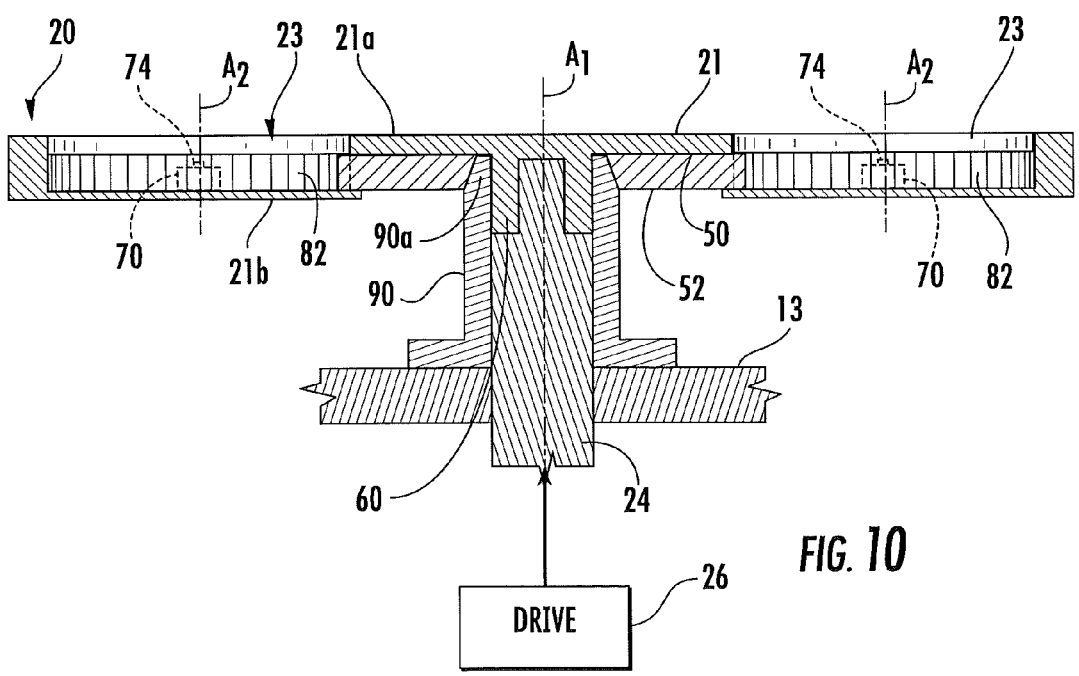
FIG. 10 is a side cross sectional view of a susceptor apparatus, according to some embodiments of the present invention.

Referring now to FIGS. 2-10, the susceptor apparatus 20 will be described in greater detail. FIG. 2 is a top plan view of the main platter 21 and illustrates the plurality of satellite platters 23 rotatably secured within respective pockets 22 in the main platter 21. Each of the satellite platters 23 rotates about a respective central axis $A_2$ (FIG. 10). The main platter 21 has opposite first and second sides 21a, 21b. A central recess 50 (FIG. 4) is formed in the main platter second side 21b and is substantially coaxial with the rotational axis $A_1$ (FIG. 10) of the main platter 21. A plurality of circumferentially spaced-apart pockets 22 are formed in the main platter first side 21a.

A plurality of satellite platters 23 are rotatably secured within the respective pockets 22. Each satellite platter 23 has a wafer support surface 80 on a first side 23a (FIG. 7) thereof and a planet gear 82 on an opposite second side 23b (FIG. 8) thereof, as illustrated. The wafer support surface 80 of each satellite platter 23 is circumferentially surrounded by a raised peripheral edge portion 84. It is upon this wafer support surface 80 that a wafer, on which epitaxial layers are grown during a CVD process, is positioned. In some embodiments, the wafer support surface 80 of a satellite platter 23 is substantially flat. In other embodiments, the wafer support surface 80 of a satellite platter 23 has a non-flat contour that facilitates uniform wafer temperatures during epitaxial growth.

For certain wafers, it is difficult if not impossible to obtain uniform wafer temperature with conventional flat wafer support surfaces. With non-flat contoured wafer support surfaces, according to embodiments of the present invention, uniform wafer temperatures can be obtained.

Each planet gear 82 includes teeth 82t along the outer periphery thereof, as illustrated in FIG. 8. Each satellite platter second side 23b includes a spindle recess 76 and a bearing surface 78 (FIG. 8). The spindle recess 76 is configured to receive a spindle post (74, FIG. 6) extending outwardly from a respective pocket, as described in detail below.

The illustrated main platter 21 and individual satellite platters 23 are circular in shape. The satellite platters 23 are arranged symmetrically around the main platter 21, as illustrated in FIG. 2. In addition, the satellite platters are each located the same radial distance outward from the center of the main platter 21. Although six satellite platters 23 are illustrated, other numbers of satellite platters 23 are possible, both greater than six and less than six.

As will be described below, the planet gear teeth 82t of each planet gear 82 are configured to mesh with the teeth 52t of a central gear 52 such that rotation of the main platter 21 about its rotational axis $A_1$ causes the satellite platters 23 to rotate about their individual rotational axes $A_2$ (FIG. 10). During the deposition process, the main platter 21 of the susceptor apparatus 20 is rotated by the drive shaft 24 to cause the planetary rotational motions of the satellite platters 23. This planetary rotation arrangement may result in improved epitaxial layer thickness and doping uniformity. Moreover, issues, such as the introduction of impurities, unwanted gases, and wafer cooling, that are associated with gas rotation of conventional susceptor apparatus are avoided via embodiments of the present invention.

Figure 4:
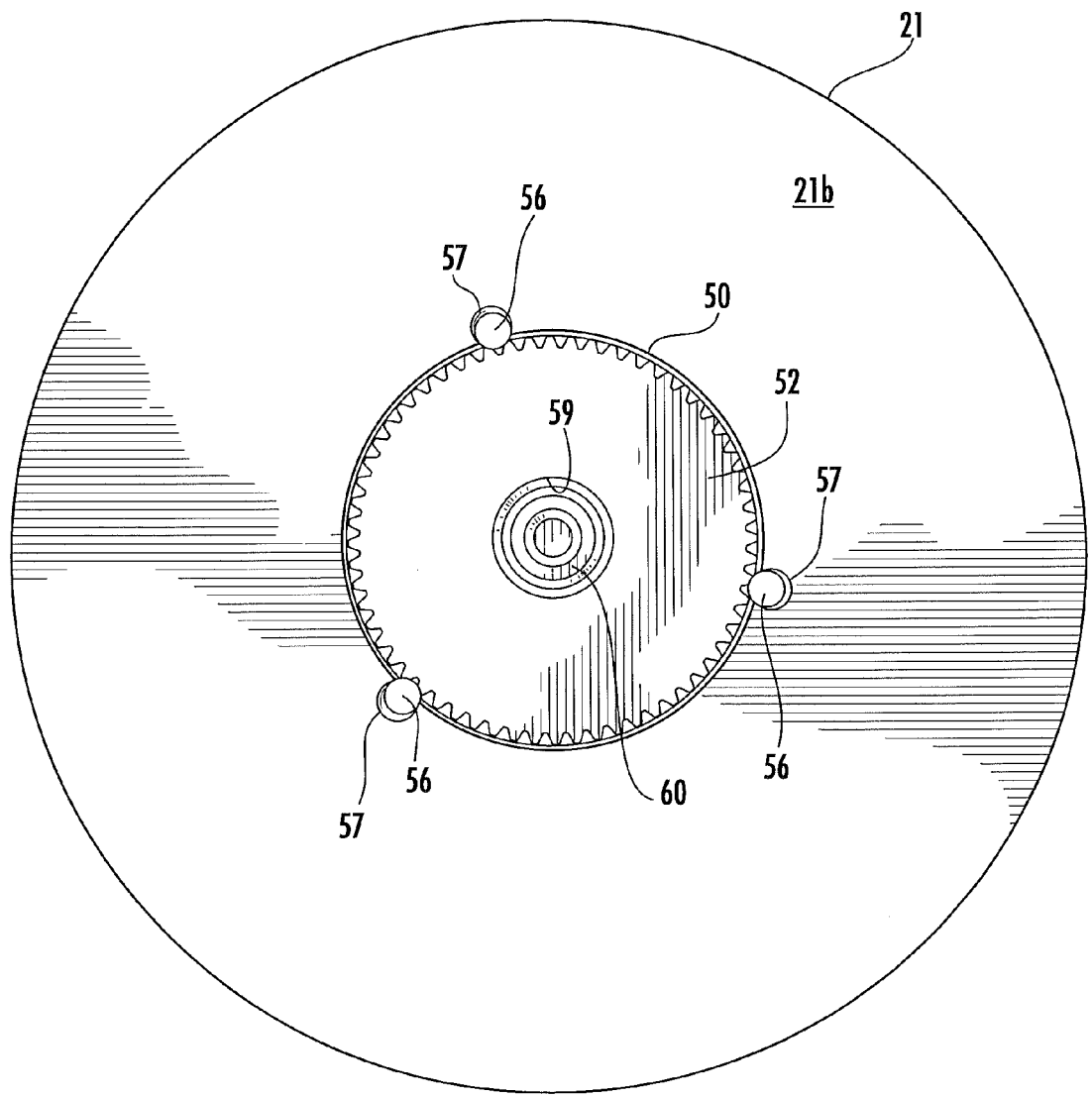
FIG. 4 is a bottom plan view of the main platter of the susceptor apparatus of FIG. 1 that illustrates the central gear.
Figure 5:
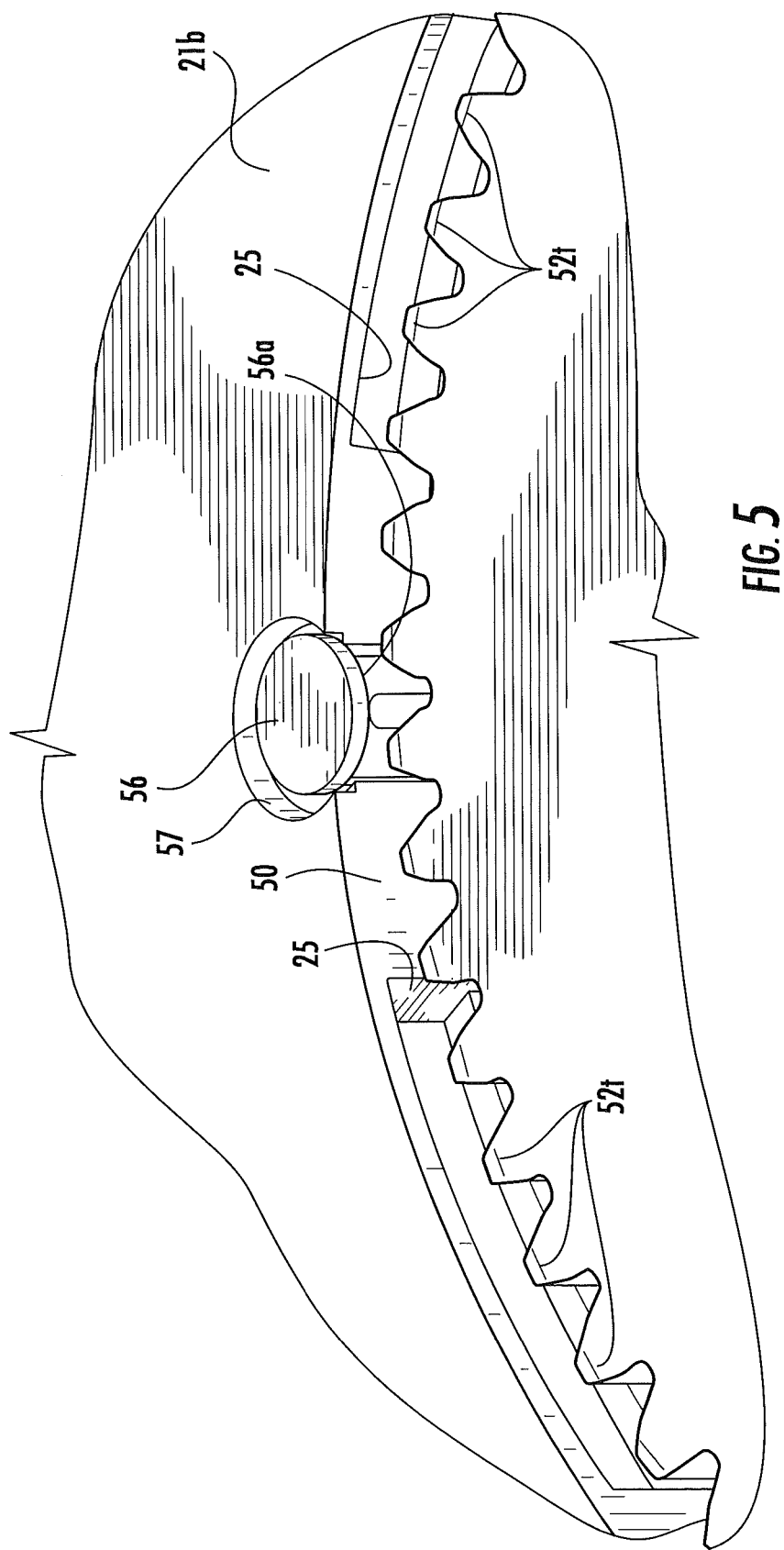
FIG. 5 is an enlarged partial perspective view of the main platter of FIG. 4, and illustrating a member that retains the central gear within the main platter central recess, according to some embodiments of the present invention.

Referring now to FIG. 4, a central gear 52 is positioned within the central recess 50 and is substantially coaxial with the rotational axis $A_1$ (FIG. 10) of the main platter 21. The central gear 52 includes teeth 52t along its outer periphery, as illustrated. The central gear 52 is retained within the central recess 50 by a plurality of retaining members 56, each positioned within respective apertures 57 in the main platter 21. Each retaining member 56 in the illustrated embodiment has an elliptical shaped end portion 56a (FIG. 5). Each retaining member is rotatable within a respective aperture 57 such that the elliptical shaped end portion 56a can overlie a portion of the central gear 52 and, thereby, retain the central gear 52 within the central recess 50. A locking pin 58 (FIG. 6) is associated with each retaining member 56 to prevent rotation of the locking member 56 and to maintain the retaining member 56 in a locking position. Upon removing the pin 58, the respective retaining member 56 can be rotated within the aperture 57 to a position such that the central gear 52 can be removed from the central recess 50. Embodiments of the present invention, however, are not limited to the configuration and operation of the illustrated retaining members 56. Various other ways of maintaining the central gear 52 within the central recess 50 can be used, without limitation.

Figure 3:
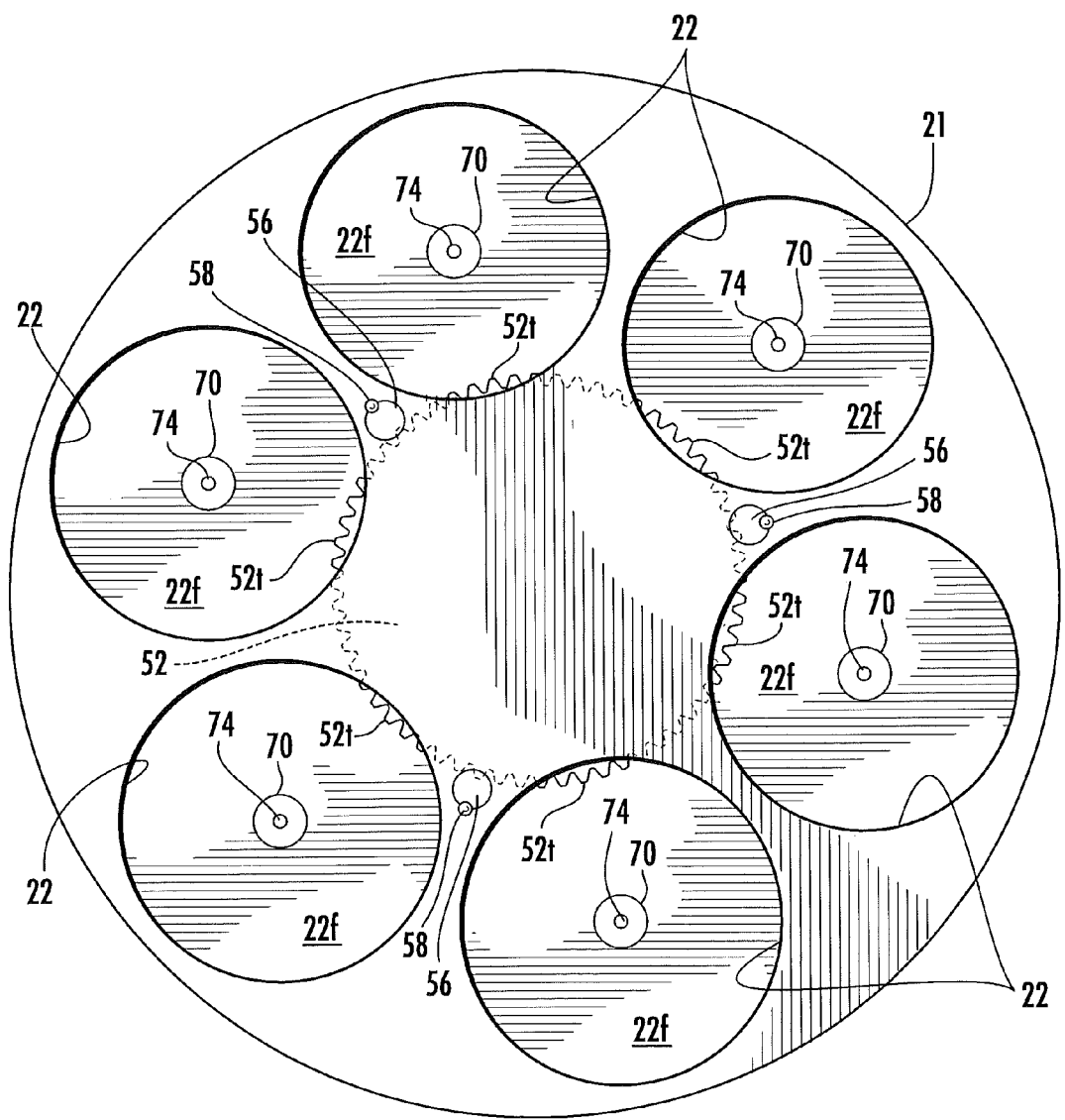
FIG. 3 is a top plan view of the main platter of FIG. 2 with the satellite platters removed, and illustrating the corresponding plurality of pockets.
Figure 6:
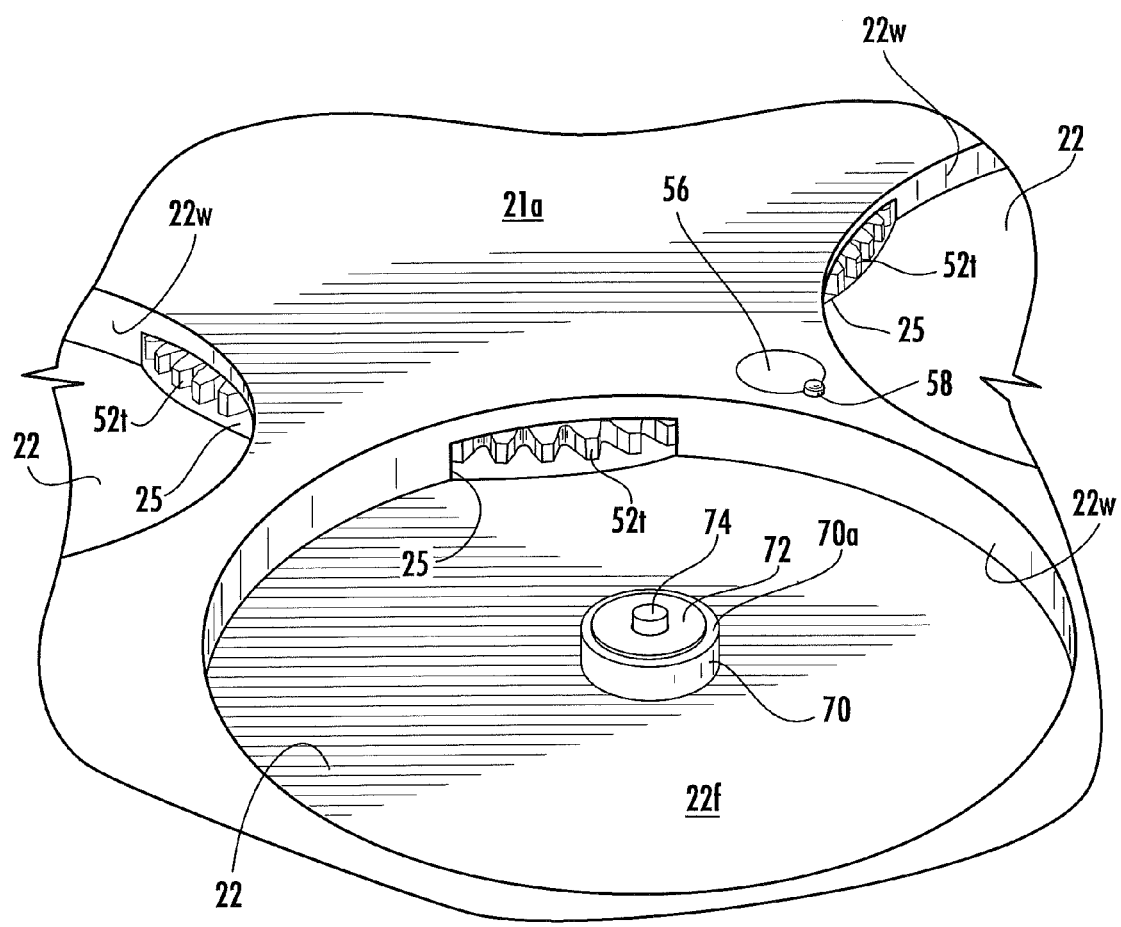
FIG. 6 is an enlarged partial perspective view of the main platter of FIG. 3, and illustrating central gear teeth extending into the pockets, according to some embodiments of the present invention.
Figure 7:
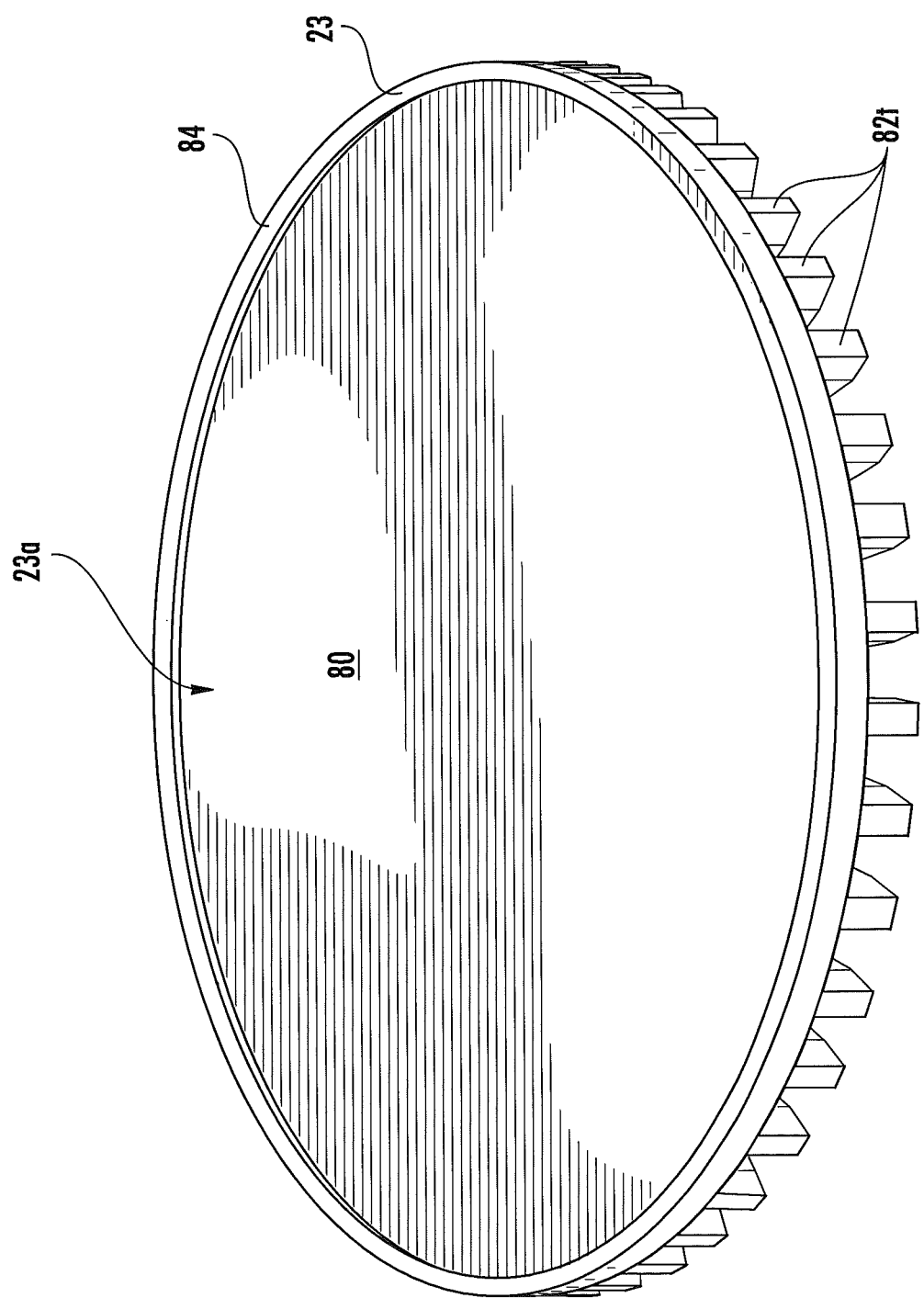
FIG. 7 is a top perspective view of a satellite platter of the susceptor apparatus of FIG. 2.

As illustrated in FIGS. 3 and 6, each pocket 22 has a peripheral wall 22w with an opening 25 in communication with the central recess 50. The central gear teeth 52t extend into each of the pockets 22 via the respective wall openings 22w, as illustrated.

The main platter 21 includes a coupling 60 (FIG. 4) that extends outwardly from the main platter second side 21b along the rotational axis $A_1$ of the main platter. The coupling 60 is configured to receive the free end 24a of a drive shaft 24 (FIG. 10) therein and to cause the main platter 21 to rotate in response to rotation of the drive shaft 24. The central gear 52 includes a central aperture 59 through which the coupling 60 extends, as illustrated in FIG. 4.

As illustrated in FIGS. 3 and 6, each pocket 22 includes a pedestal 70 that extends upwardly from a central portion of the floor 22f of the pocket 22. Each pedestal 70 has a free end 70a with a spindle post 74 (FIG. 6) extending outwardly therefrom. Each spindle post 74 is configured to engage a respective spindle recess 76 (FIG. 8) in a satellite platter second side 23b. Each pedestal free end 70a may serve as a bearing surface for rotationally supporting a respective satellite platter 23. Each pedestal free end 70a may include a low-friction material that serves as the bearing surface 72. Each satellite platter 23 may also utilize a similar low-friction material that serves as a bearing surface 78. Any low-friction material utilized is designed to withstand the high operation temperatures that the susceptor apparatus 20 may be exposed to. In the illustrated embodiment, the bearing surface 72 lies within a plane that is substantially perpendicular to the rotational axis $A_2$ defined by the spindle post 74, and the bearing surface 78 lies within a plane that is substantially perpendicular to a rotational axis $A_3$ defined by the spindle recess 76 (FIG. 8).

In some embodiments, each pedestal free end 70a may include a thrust washer that serves as the bearing surface 72. Material for the spindle post 74 and thrust washer 72, when utilized, may be dissimilar to the satellite and main platter material. However, material for the spindle post 74 and thrust washer 72, when utilized, is refractory (i.e., capable of retaining strength at high temperatures).

When a satellite platter 23 is rotatably positioned within a respective pocket 22, the bearing surface 78 surrounding the spindle recess 76 engages the bearing surface 72 of a pedestal 70 within the pocket 22, and the rotational axes $A_2$ and $A_3$ become the same. The engagement of the respective bearing surfaces 78, 72 allows a satellite platter 23 to rotate about a spindle post 74 smoothly and consistently within a respective pocket 22.

In other embodiments, each spindle post 74 may be configured to rotatably support a respective satellite platter 23 without requiring any other supporting contact between the satellite platter 23 and the pocket. For example, in some embodiments, each spindle post 74 provides both the rotational and thrust support for a respective satellite platter 23 and no contact of surfaces 72 and 78 is required.

Referring to FIGS. 9 and 10, the drive shaft 24 is concentrically surrounded by a tube 90 that is fixed, for example to the bottom 13 of the reactor 10. The tube 90 has a free end 90a that engages the central gear aperture 59 when the drive shaft 24 and main platter coupling 60 are engaged. The tube free end 90a maintains the central gear 52 in a stationary position as the drive shaft 24 rotates the main platter 21 about the main platter rotational axis $A_1$. Because the planet gears 82 are engaged with the central gear 52, rotation of the main platter 21 about its rotational axis $A_1$ causes each individual satellite platter 23 to rotate about its rotational axis $A_2$ within a respective pocket 22. As such, a wafer positioned on a satellite platter 23 is mechanically rotated via rotation of the main platter 21. In addition, only a single drive mechanism (e.g., an electric motor 26 coupled to a drive shaft 24) is needed to cause rotation of both the main platter 21 about its rotational axis $A_1$ and rotation of each of the satellite platters about their respective rotational axes $A_2$. The term "single drive mechanism" is intended to include any single device configured to rotate the drive shaft 24.

Figure 11:
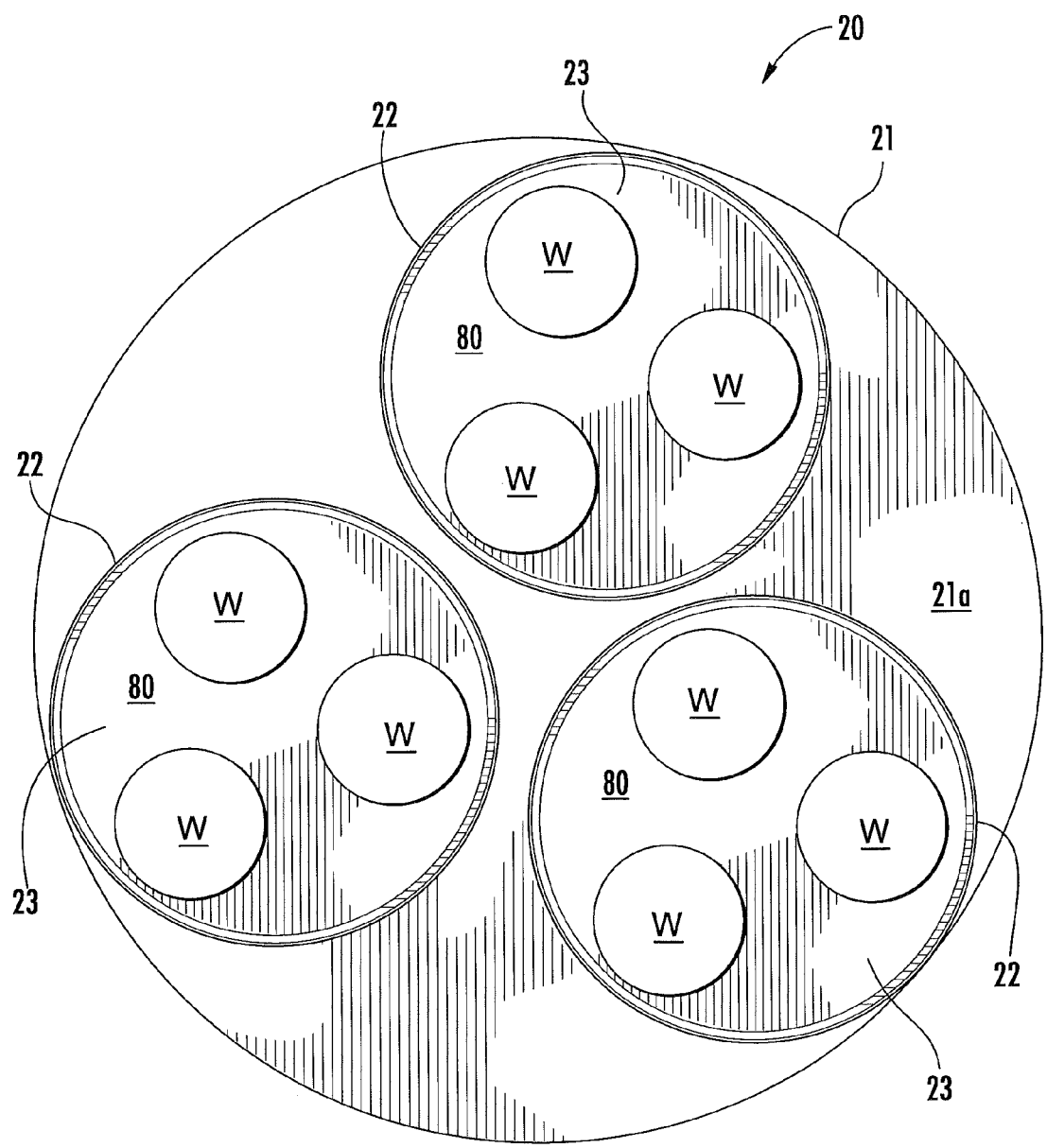
FIG. 11 is a top plan view of a main platter for the susceptor apparatus of FIG. 1 that illustrates a plurality of satellite platters, according to some embodiments of the present invention.

Referring now to FIG. 11, a susceptor apparatus 20, according to other embodiments of the present invention, is illustrated. The susceptor apparatus 20 includes a rotatable main platter 21 and a plurality of rotatable satellite platters 23 positioned on a first side 21a of the main platter 21. The satellite platters 23 may be rotatably positioned on the first side 21a or may be rotatably positioned within pockets 22 formed within the main platter first side 21a, as described above. In the illustrated embodiment, each satellite platter 23 has a wafer support surface 80 that is configured to hold one or more wafers W. The satellite platters 23 are operably connected to the main platter 21 such that rotation of the main platter 21 about its rotational axis causes the satellite platters 23 to rotate about their individual rotational axes. For example, each satellite platter 23 may have a wafer support surface 80 on a first side thereof and a planet gear on an opposite second side thereof, as described above. Each planet gear meshes with a central gear associated with the main platter 21 such that rotation of the main platter 21 about its rotational axis, for example, via a drive shaft 24 (FIG. 10) and single drive device 26 (FIG. 10), causes the satellite platters 23 to rotate about their individual rotational axes.

In some embodiments, the wafer support surface 80 of each satellite platter 23 is circumferentially surrounded by a raised peripheral edge portion, as described above. In some embodiments, the wafer support surface 80 of each satellite platter 23 may have a substantially flat configuration. In other embodiments, the wafer support surface 80 of each satellite platter 23 may have a contoured configuration to facilitate uniform wafer temperatures.

According to other embodiments of the present invention, in lieu of supporting one or more wafers W, as illustrated in FIG. 11, each satellite platter 23 may include one or more wafer supports (not shown) rotatably secured to each satellite platter 23. The wafer supports may be rotatably positioned on each satellite platter 23 or may be rotatably positioned within pockets formed within each satellite platter. The wafer supports may be operably connected to the satellite platters 23, for example via gears, as described above, such that rotation of a satellite platter 23 causes rotation of individual wafer supports. With the satellite platters 23 operably connected to the main platter 21, rotation of the main platter 21 about its rotational axis causes the satellite platters to rotate about their individual rotational axes and the one or more wafer supports to rotate about their individual rotational axes. As such, with a single mechanism (e.g., a motor coupled to a drive shaft, etc.) rotation about multiple axes is achieved for a susceptor apparatus.

A susceptor apparatus may be exposed to high temperatures (e.g., 700° C.-1,800° C.) during epitaxial growth. As such, the various components of the various susceptor apparatus 20 described herein, particularly the main platter 21, central gear 52, and satellite platters 23, etc., are formed from heat resistant materials such as, for example, graphite.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A susceptor apparatus, comprising:
   a rotatable main platter comprising opposite first and second sides, a central recess formed in the second side substantially coaxial with a rotational axis of the main platter, and a plurality of circumferentially spaced-apart pockets formed in the first side;
   a central gear positioned within the central recess; and
   a plurality of rotatable satellite platters positioned on the main platter and each rotatably secured within a respective pocket, wherein each satellite platter has a wafer support surface on a first side thereof and a planet gear on an opposite second side thereof, wherein each planet gear meshes with the central gear such that rotation of the main platter about its rotational axis causes the satellite platters to rotate within their respective pockets about their individual rotational axes.

2. The susceptor apparatus of claim 1, wherein each satellite platter wafer support surface is configured to hold one or more wafers.

3. The susceptor apparatus of claim 1, wherein the wafer support surface of each satellite platter is circumferentially surrounded by a raised peripheral edge portion.

4. The susceptor apparatus of claim 1, wherein the wafer support surface of each satellite platter is contoured.

5. The susceptor apparatus of claim 1, further comprising a drive shaft coupled to the main platter such that rotation of the drive shaft causes the main platter to rotate about its rotational axis.

6. The susceptor apparatus of claim 5, further comprising a drive mechanism coupled to the drive shaft and configured to rotate the drive shaft.

7. The susceptor apparatus of claim 1, wherein each satellite platter comprises one or more wafer supports rotatably secured within the satellite platter, and wherein rotation of the main platter about its rotational axis causes the satellite platters to rotate about their individual rotational axes and the one or more wafer supports to rotate about their individual rotational axes.

8. The susceptor apparatus of claim 1, further comprising a coupling extending from the main platter second side along the rotational axis of the main platter, wherein the coupling is configured to receive a free end of a drive shaft therein and to cause the main platter to rotate in response to rotation of the drive shaft.

9. The susceptor apparatus of claim 8, wherein the central gear comprises a central aperture, and wherein the coupling extends through the central gear central aperture.

10. The susceptor apparatus of claim 9, wherein the drive shaft is concentrically surrounded by a fixed tube, wherein the tube comprises a free end that engages the central gear aperture when the drive shaft and coupling are engaged, and wherein the tube free end maintains the central gear in a stationary position as the drive shaft rotates the main platter about the main platter rotational axis.

11. The susceptor apparatus of claim 1, wherein the central gear is removably retained within the central recess by a plurality of retaining members positioned along a periphery of the central recess.

12. The susceptor apparatus of claim 1, wherein each pocket includes a spindle post and a first bearing surface, wherein each satellite platter second side includes a spindle recess and a second bearing surface, wherein the spindle recess is configured to receive the spindle post therein such that the first and second bearing surfaces engage and such that the satellite platter can rotate about the spindle post.

13. The susceptor apparatus of claim 12, wherein each pocket includes a pedestal having a free end, wherein the pedestal free end comprises the first bearing surface and wherein the spindle post extends outwardly from the pedestal free end.

14. The susceptor apparatus of claim 1, wherein each pocket includes a spindle post, and wherein each satellite platter second side includes a spindle recess that receives a spindle post therein such that the satellite platter is rotatably supported by the spindle post.

15. The susceptor apparatus of claim 1, wherein each pocket has a peripheral wall with an opening in communication with the central recess, and wherein central gear teeth extend into each of the pockets via the respective wall openings.

16. An epitaxial growth reactor, comprising:
a reactor vessel having a wall; and
a susceptor apparatus rotatably disposed within the reactor vessel, wherein the susceptor apparatus comprises:
a rotatable drive shaft extending into the reactor vessel from the wall;
a main platter attached to the rotatable drive shaft, wherein the main platter comprises opposite first and second sides, a central recess formed in the second side substantially coaxial with a rotational axis of the main platter, and a plurality of circumferentially spaced-apart pockets formed in the first side;
a central gear positioned within the central recess; and
a plurality of satellite platters, each rotatably secured within a respective pocket, wherein each satellite platter has a wafer support surface on a first side thereof and a planet gear on an opposite second side thereof, wherein each planet gear meshes with the central gear such that rotation of the main platter about its rotational axis via the drive shaft causes the satellite platters to rotate within their respective pockets about individual rotational axes.

17. The epitaxial growth reactor of claim 16, further comprising a tube concentrically surrounding the drive shaft in spaced-apart relationship, wherein the tube is secured at one end to the reactor vessel wall and at an opposite end to the central gear, and wherein the tube maintains the central gear in a stationary position as the drive shaft rotates the main platter about the main platter rotational axis.

18. The epitaxial growth reactor of claim 16, wherein each pocket includes a spindle post and a first bearing surface, wherein each satellite platter second side includes a spindle recess and a second bearing surface, wherein the spindle recess is configured to receive the spindle post therein such that the first and second bearing surfaces engage and such that the satellite platter can rotate about the spindle post.

19. The epitaxial growth apparatus of claim 18, wherein each pocket includes a pedestal having a free end, wherein the pedestal free end comprises the first bearing surface and wherein the spindle post extends outwardly from the pedestal free end.

20. The epitaxial growth apparatus of claim 16, wherein each pocket includes a spindle post, and wherein each satellite platter second side includes a spindle recess that receives a spindle post therein such that the satellite platter is rotatably supported by the spindle post.

21. The epitaxial growth reactor of claim 16, wherein the wafer support surface is contoured.

22. The epitaxial growth reactor of claim 16, wherein the wafer support surface of each satellite platter is circumferentially surrounded by a raised peripheral edge portion.

23. The epitaxial growth reactor of claim 16, wherein each pocket has a peripheral wall with an opening in communication with the central recess, and wherein central gear teeth extend into each of the pockets via the respective wall openings.

24. A wafer support for a susceptor apparatus, comprising a platter having a wafer support surface on a first side thereof and a planet gear on an opposite second side thereof, wherein the platter second side includes a spindle recess configured to receive a spindle post therein such that the platter can rotate about the spindle post.

25. The wafer support of claim 24, wherein the wafer support surface is circumferentially surrounded by a raised peripheral edge portion.

26. A method of rotating a susceptor apparatus, wherein the susceptor apparatus includes a main platter having a plurality of circumferentially spaced-apart pockets formed in a first side and a central recess formed in an opposite second side, a central gear positioned within the central recess, and a plurality of satellite platters rotatably secured within the respective pockets, each satellite platter operably associated with the central gear, the method comprising rotating the main platter via a drive shaft connected to the main platter second side at a rotational axis of the main platter while maintaining the central gear stationary such that the satellite platters rotate within their respective pockets about individual rotational axes.

27. A method of facilitating epitaxial growth on a substrate, wherein the substrate is positioned on a satellite platter that is rotatably positioned on a main platter, the method comprising rotating the main platter via a single drive mechanism connected to the main platter at a rotational axis thereof, wherein the main platter rotation causes the substrate to rotate.

* * * * *